United States Patent
Gakis et al.

(10) Patent No.: US 8,338,228 B2
(45) Date of Patent: Dec. 25, 2012

(54) METHOD OF DETACHING A THIN SEMICONDUCTOR CIRCUIT FROM ITS BASE

(75) Inventors: Andreas Gakis, Hamburg (DE); Wolfgang Schnitt, Norderstedt (DE)

(73) Assignee: NXP B.V., Eindhoven (NL)

( * ) Notice: Subject to any disclaimer, the term of this patent is extended or adjusted under 35 U.S.C. 154(b) by 753 days.

(21) Appl. No.: 11/574,014

(22) PCT Filed: Aug. 9, 2005

(86) PCT No.: PCT/IB2005/052635
§ 371 (c)(1),
(2), (4) Date: Apr. 8, 2009

(87) PCT Pub. No.: WO2006/018787
PCT Pub. Date: Feb. 23, 2006

(65) Prior Publication Data
US 2009/0215226 A1  Aug. 27, 2009

(30) Foreign Application Priority Data
Aug. 20, 2004 (EP) .................................... 04104002

(51) Int. Cl.
*H01L 21/00* (2006.01)

(52) U.S. Cl. ................ 438/106; 257/E21.499

(58) Field of Classification Search .................. 438/106; 257/E21.499
See application file for complete search history.

(56) References Cited

U.S. PATENT DOCUMENTS

| 6,183,588 B1 | 2/2001 | Kelly et al. |
| 6,339,010 B2 | 1/2002 | Sameshima |
| 6,444,560 B1 * | 9/2002 | Pogge et al. ................... 438/612 |
| 6,784,547 B2 | 8/2004 | Pepe et al. |
| 6,864,172 B2 | 3/2005 | Noma et al. |
| 7,335,527 B2 * | 2/2008 | Sawyer et al. ................... 438/50 |
| 2001/0005043 A1 * | 6/2001 | Nakanishi et al. ............ 257/678 |
| 2003/0057525 A1 * | 3/2003 | Fock et al. ..................... 257/629 |

FOREIGN PATENT DOCUMENTS

WO    WO 2004059720 A1 *  7/2004

* cited by examiner

*Primary Examiner* — William D Coleman
*Assistant Examiner* — Christine Enad

(57) ABSTRACT

In order to provide a method of detaching a thin semiconductor circuit (1) from its base (2), wherein the semiconductor circuit (1) is provided with terminals (3) for electrical contacting, in particular with gold contacts, by means of which method thin semiconductor circuits (1) can also be mounted without damage for example directly on a chip card, it is proposed that a layer of soldering tin (6) is applied to a support substrate (4), the support substrate (4) is soldered to the electrical terminals (3) and the base (2) of the semiconductor circuit (1) is removed.

10 Claims, 3 Drawing Sheets

METHOD OF DETACHING A THIN SEMICONDUCTOR CIRCUIT FROM ITS BASE

The invention relates to a method of detaching a thin semiconductor circuit from its base, wherein the semiconductor circuit is provided with terminals for electrical contacting, in particular with gold contacts.

Semiconductor circuits, which consist of resistors, capacitors, transistors and the like and are formed in photolithographic methods on silicon wafers, are referred to as chips and are used as electronic components to control various functions in modern electrical and electronic devices. The term "chip" is also to be understood here as meaning individual components or discrete semiconductors.

Particularly for the use of chips in so-called chip cards or "smartcards", it is necessary for the chips to be separated from their base in order for them to be integrated into the chip card, said base usually being formed by the silicon wafer itself on which the chip was produced. The chips, in which the electronic components are usually formed in a number of layers one on top of the other, have a thickness of up to 20 μm and therefore have only low intrinsic stability. They can therefore break under their own weight as they are brought from the wafer to a mounting site.

In order to detach the chip or semiconductor circuit from its base, complex methods are known which make it possible to detach the chip without any damage. By way of example, adhesive films are arranged on the chips and the chips are detached from the base. Under the effect of heat or UV, the films lose their adhesive effect in order to release the chip from the film at the desired site. However, such films are difficult to handle and are very expensive.

DE 198 42 419 A1 discloses a method of forming semiconductor elements which comprises a step in which a film structure is separated from the substrate. In said document, as claimed in claim 1 thereof, a separation layer and a film structure are formed on a support substrate and then the separation layer is removed. However, this requires a high outlay in terms of process technology, and damage to the semiconductor circuit or to the chip during removal of the separation layer is not ruled out, so that increased waste may arise during production.

It is an object of the invention to provide a method of detaching a thin semiconductor circuit from its base, which method makes it possible for thin semiconductor circuits or chips having a thickness of up to 20 μm to be transferred without any damage directly onto a chip card.

This object is achieved by the features specified in claim 1.

The core concept of the invention is that a semiconductor circuit manufactured in a manner known per se, or a chip which is formed on a silicon wafer and is provided with terminals for electrical contacting, is attached to an additional support substrate by means of a soldering operation in order to be able to remove the base, e.g. the silicon wafer. Within the context of the invention, removal of the base takes place in any desired manner or preferably as described below. In order to attach the semiconductor circuit to the support substrate, which support substrate for its part is provided with a layer of soldering tin, use is made of the electrical terminals of the semiconductor circuit which have to be provided in any case in order to supply electrical power to the semiconductor circuit during subsequent operation. The soldering operation preferably takes place at a temperature of 250° C., at which temperature neither the chip nor the support substrate will melt but the usual melting temperature of the soldering tin of 218° C. is sufficiently exceeded. Heating takes place by heating plates known to the person skilled in the art, which heating plates bear against essentially the entire surface of the support substrate and/or base of the chip. The soldering of the electrical terminals, which are preferably designed as gold contacts or "gold bumps", ensures that the actual semiconductor circuit, which is made of sensitive silicon compounds, is not damaged, since these electrical terminals are much more resistant.

The advantage of the invention is that, by virtue of the support substrate which is connected to the semiconductor circuit via the electrical terminals, the semiconductor circuit or chip is given sufficient mechanical stability during removal of the base, so that the semiconductor circuit is not damaged during this and subsequent operating steps. The method is particularly advantageous in the case of semiconductor circuits having a maximum thickness of 20 μm, although the method can in principle also be carried out with thicker semiconductor circuits.

Advantageous embodiments of the invention are characterized in the dependent claims.

The support substrate used is preferably glass, which, given a suitable choice of type of glass and material thickness, has sufficient mechanical stability. Moreover, a support substrate made of glass is sufficiently heat-resistant to not be melted with the soldering tin during the soldering of the electrical terminals.

In order to improve the adhesion of the layer of soldering tin which is applied to the support substrate, use is made of a copper layer which is applied directly to the support substrate and is covered by the soldering tin layer. All methods known in semiconductor technology may be used to apply the individual layers to the support substrate.

In order to protect the semiconductor circuit or the chip from mechanical influences and the effects of heat during soldering of the electrical terminals to the support substrate, a polymer layer is applied between the electrical terminals of the semiconductor circuits, which polymer layer helps to stabilize and passivate the subsequent chip. This polymer layer, preferably having a thickness of 4 to 5 μm, consists for example of materials known to the person skilled in the art, such as photo-BCB, polyimide or the like. The electrical terminals remain uncovered.

In a further embodiment, it is proposed that, during the soldering of the support substrate to the electrical terminals, the support substrate and the base of the semiconductor circuit are pressed against one another with a slight pressure in order to ensure that the electrical terminals are dipped into the layer of soldering tin. The pressure and travel of the support substrate and base with respect to one another must be selected to be so slight that the electrical terminals, for example the gold contacts, do not connect with the copper layer located below the soldering tin, in order to prevent an electrical short-circuit.

In one preferred embodiment of the method, in order to remove the base of the semiconductor circuit, said base, which is designed in particular in the form of a silicon wafer, is ground and then etched in potassium hydroxide (KOH). These method steps are known to the person skilled in the art in the field of semiconductor technology. To this end, he can select the suitable abrasives for grinding the base in order to prevent any damage from being caused to the semiconductor circuit itself as a result of the grinding operation. The residues of the base are then removed by etching in potassium hydroxide.

It is furthermore proposed that a polymer as described above is likewise applied to the rear side of the semiconductor circuit, from which the base has been removed, in order also to stabilize and passivate this rear side.

For further handling of the semiconductor circuit or chip, the support substrate with the semiconductor circuit soldered thereto can be brought into a desired position for example in the region of a chip card made of plastic, in order to fix the chip there in or on the chip card. For this, the soldered connection between the support substrate and the semiconductor circuit is heated again, so that the semiconductor circuit can in turn be fixed on or in the chip card using any known fixing method. By way of example, the semiconductor circuit may be pressed into a heated area of the plastic material of the chip card and then the soldered connection can be released.

The invention will be further described with reference to an example of embodiment shown in the drawings to which, however, the invention is not restricted.

FIGS. 1 to 6 show, in cross section, a semiconductor circuit 1, for example a chip, which consists of resistors, transistors, capacitors and the like. The semiconductor circuit 1 is formed using photolithographic methods known to the person skilled in the art on a base 2, preferably a silicon wafer, in particular in a multilayer manner. The multilayer structure can be seen in FIG. 1 by the elements of the semiconductor circuit 1 on the base 2, said elements being arranged one above the other. The semiconductor circuit 1 has a thickness of up to 20 μm.

Figure 1:
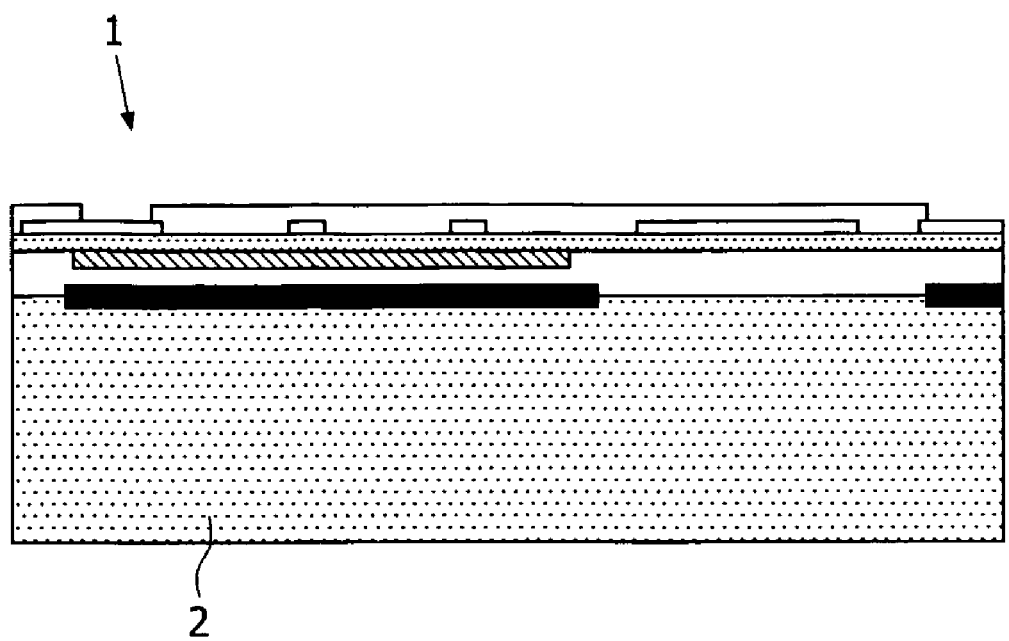
FIG. 1 shows a semiconductor circuit on its base.
Figure 2:
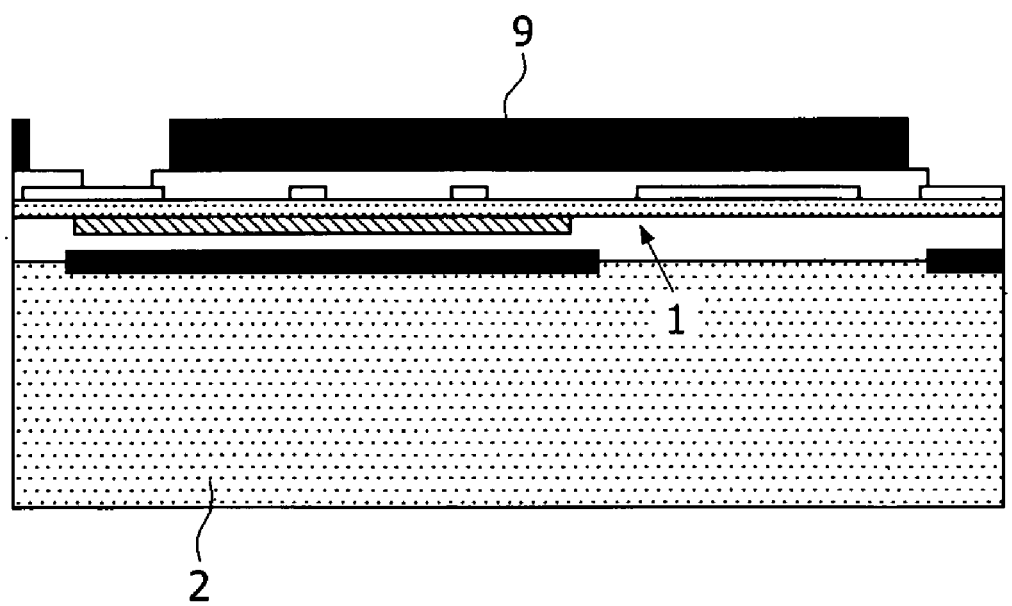
FIG. 2 shows a semiconductor circuit provided with a resist.

Ti silicide or other silicides for example are used to contact the Si contacts. A thin metal base is formed thereon, for example a TiPtAu layer is sputtered thereon with a thickness of approximately 0.2 μm. This layer subsequently serves to supply electrical power. Electrical contacts 3, preferably in the form of so-called gold bumps, have to be provided for contacting the semiconductor circuit 1. To this end, the semiconductor circuit 1, as shown in FIG. 2, is firstly provided with an approximately 8 μm-thick layer of a photoresist 9, in which the subsequent electrical contacts 3 are cut out. In a galvanic bath, these gaps are filled with a gold layer having a thickness of 8 to 10 μm, and the photoresist 9 is removed again in a method commonly used in semiconductor technology.

The electrical contacts 3 may also be interleaved with an adjacent chip in such a way that the design of the separation path which has been etched free is not adversely affected. However, they may also be arranged within a circuit design. Any remaining TiPtAu layer is homogenously removed by an etching agent or back-sputtered. Providing a semiconductor circuit 1 with gold bumps is a process with which the person skilled in the art is familiar.

Figure 3:
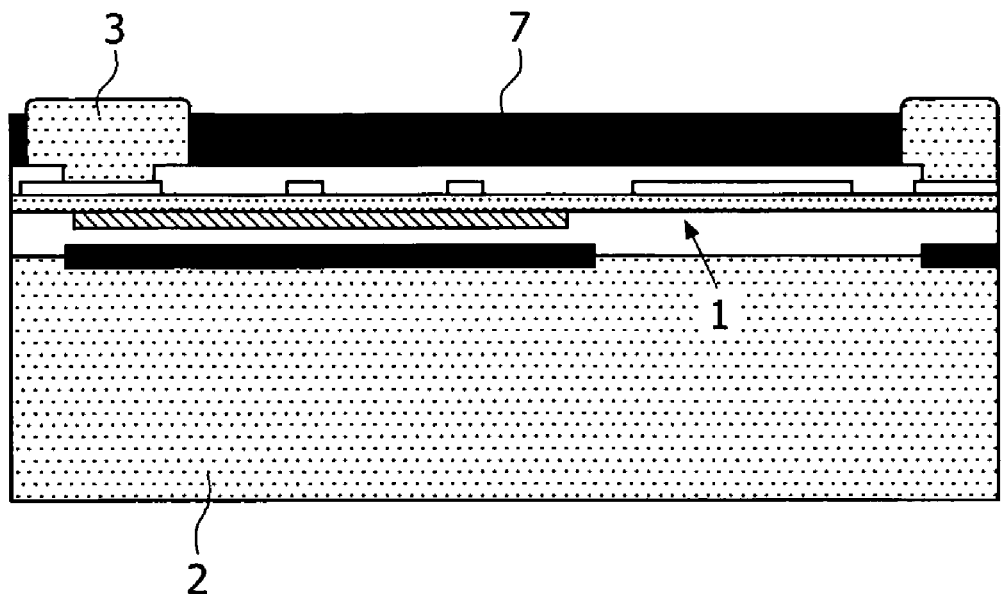
FIG. 3 shows a semiconductor circuit with electrical terminals.

In addition, as can be seen from FIG. 3, a 4 to 5 μm-thick polymer layer 7, for example photo-BCB or polyimide, is applied in order to stabilize and passivate the subsequent thin chip, wherein the electrical contacts 3 remain uncovered.

Figure 4:
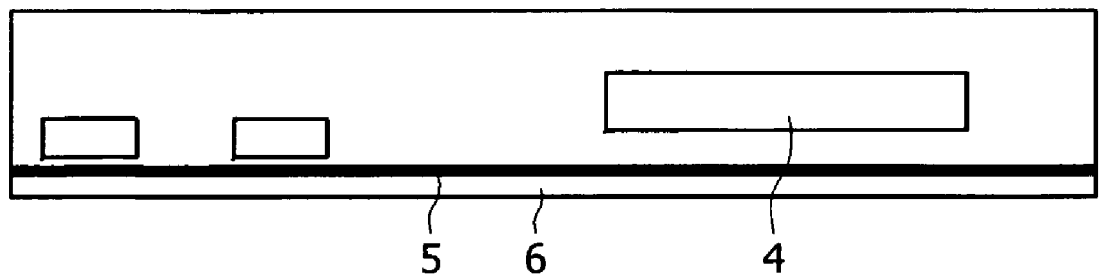
FIG. 4 shows a support substrate.

FIG. 4 shows the support substrate 4, preferably a glass plate having sufficient strength, temperature-resistance and bending strength. In order to improve the adhesion, a copper layer 5 and then the soldering tin 6 are applied to the support substrate 4 using methods known in semiconductor technology.

Figure 5:
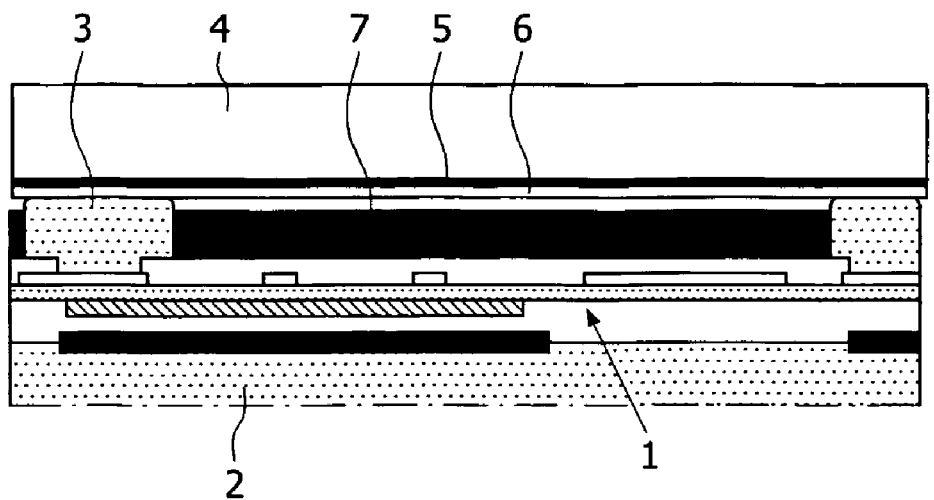
FIG. 5 shows the support substrate soldered to the semiconductor circuit.
Figure 6:
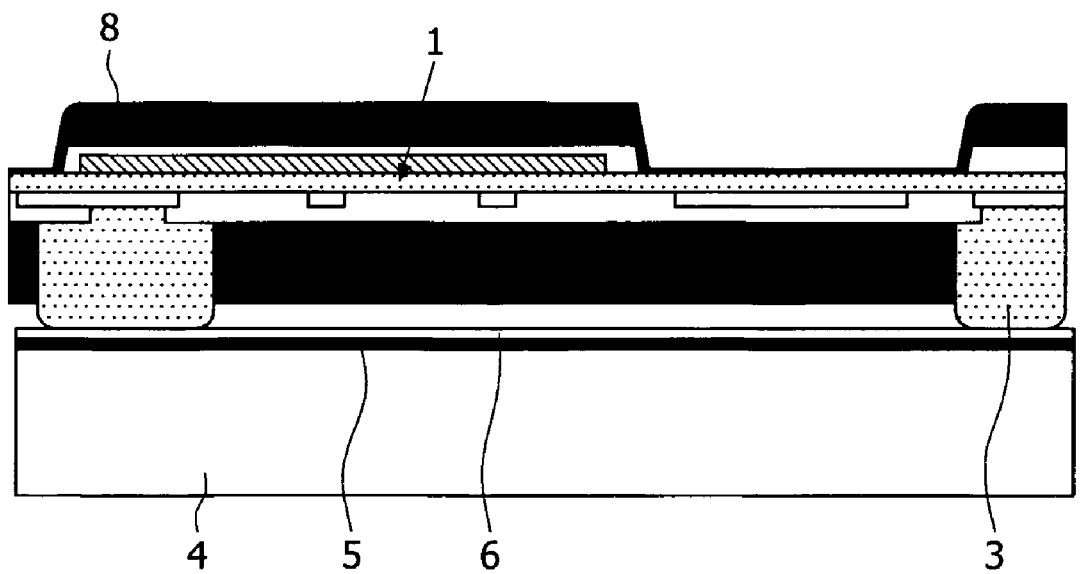
FIG. 6 shows the semiconductor circuit with the base detached.

The connection between the support substrate 4 and the semiconductor circuit 1 can be seen from the diagram in FIG. 5. For this, either the support substrate 4 and/or the base 2 is heated to approximately 250° C., preferably by means of a heating plate, wherein the melting point of the soldering tin 6 is usually 218° C. A slight pressure is then exerted on the support substrate 4 and the base 2 so that the electrical contacts 3 dip into the soldering tin 6 without this leading to an electrical short-circuit between the electrical contacts 3 and the copper layer 5.

The base 2 is then ground using suitable means and etched for example in potassium hydroxide (KOH) in order to uncover the actual semiconductor circuit 1, which is connected to the support substrate 4 via the electrical contacts 3.

In order to stabilize and passivate the semiconductor circuit 1, a polymer layer 8 of the abovementioned polymers is likewise applied to its uncovered rear side, wherein the semiconductor circuit 1 is in this case upside down compared to the previous figures.

For further handling of the semiconductor circuit 1, the support substrate 4 can be heated again in order to release the soldered connection between the soldering tin 6 and the electrical contacts 3 and to place the semiconductor circuit 1 for example in a chip card.

LIST OF REFERENCES 1 semiconductor circuit
2 base
3 electrical contacts
4 support substrate
5 copper layer
6 soldering tin
7 polymer layer
8 polymer layer
9 photoresist

The invention claimed is:

1. A method of detaching a thin semiconductor circuit from its base wherein the semiconductor circuit is provided with terminals for electrical contacting, the terminals in particular consisting of gold contacts, characterized in that a layer of soldering tin is applied directly to a support substrate the support substrate is soldered to the electrical terminals and the base of the semiconductor circuit is removed.

2. A method as claimed in claim 1, characterized in that glass is used as the support substrate.

3. The method of claim 2, wherein the glass is sufficiently heat-resistant to not be melted in response to the support substrate being soldered to the electrical terminals.

4. A method as claimed in claim 1, characterized in that a copper layer is inserted between support substrate and soldering tin.

5. The method of claim 4, wherein the electrical terminals do not connect with the copper layer in response to the support substrate being soldered to the electrical terminals.

6. A method as claimed in any claim 1, characterized in that a polymer layer is applied between the electrical terminals.

7. A method as claimed in claim 1, characterized in that the support substrate and the semiconductor circuit are soldered under pressure.

8. A method as claimed in claim 1, characterized in that the base in particular a silicon wafer, is ground and etched in potassium hydroxide (KOH).

9. A method as claimed in claim 1, characterized in that a polymer layer is applied to the rear side of the semiconductor circuit, from which the base has been removed.

10. A method as claimed in claim 1, characterized in that the support substrate is removed again from the semiconductor circuit under the effect of heat.

* * * * *